(12) United States Patent
Moraveji

(10) Patent No.: US 6,249,153 B1
(45) Date of Patent: Jun. 19, 2001

(54) HIGH SLEW RATE INPUT DIFFERENTIAL PAIR WITH COMMON MODE INPUT TO GROUND

(75) Inventor: Farhood Moraveji, San Jose, CA (US)

(73) Assignee: Micrel Incorporated, San Jose, CA (US)

( * ) Notice: Subject to any disclaimer, the term of this patent is extended or adjusted under 35 U.S.C. 154(b) by 0 days.

(21) Appl. No.: 09/318,399

(22) Filed: May 25, 1999

(51) Int. Cl.[7] .................................................... H03F 3/45
(52) U.S. Cl. .............................................. 327/65; 327/563
(58) Field of Search .................................. 327/561, 562, 327/563, 52, 53, 65, 66, 89, 359; 330/252–254, 257, 277, 278

(56) References Cited

U.S. PATENT DOCUMENTS

| | | | |
|---|---|---|---|
| 5,374,897 | 12/1994 | Moraveji | 330/252 |
| 5,521,553 | 5/1996 | Butler | 330/265 |
| 5,684,419 | * 11/1997 | Murden et al. | 327/104 |
| 5,714,906 | * 2/1998 | Motamed et al. | 327/563 |
| 5,841,310 | * 11/1998 | Kalthoff et al. | 327/337 |

FOREIGN PATENT DOCUMENTS 0 507 388    10/1992    (EP) ................................. H03F/3/45

* cited by examiner

Primary Examiner—Tuan T. Lam
(74) Attorney, Agent, or Firm—Skjerven Morrill MacPherson LLP; Brian D. Ogonowsky; Carmen C. Cook

(57) ABSTRACT

A differential pair includes a first and second transistors each having a control terminal coupled to a first input voltage, and a third and fourth transistors each having a control terminal coupled to a second input voltage. The first, second, third, and fourth transistors each has a first current handling terminal coupled to a reference voltage. The first and second transistors each has a second current handling terminal coupled to a first current mirror. The third and fourth transistors each has a second current handling terminal coupled to a second current mirror. A resistor is coupled between the second current handling terminals of the second and third transistors. The differential pair is capable of attaining a high slew rate and a possible common mode input voltage of ground while drawing only a small quiescent current.

6 Claims, 7 Drawing Sheets

HIGH SLEW RATE INPUT DIFFERENTIAL PAIR WITH COMMON MODE INPUT TO GROUND

BACKGROUND OF THE INVENTION

1. Field of the Invention

The invention generally relates to differential pairs and, in particular, the present invention relates to a differential pair capable of attaining a high slew rate and a common mode input to ground.

2. Background of the Invention

Differential pairs are widely used in constructing analog circuits such as operational amplifiers and comparators. A conventional emitter-coupled FIG. 1a, NPN transistors 12a and 14a form the emitter-coupled differential pair driven by constant current source 10a, which provides a constant current $I_T$, also called the tail current, to the differential pair. In FIG. 1a, a differential voltage $V_d$ represents the difference between the input voltages applied to the base terminals of transistors 12a and 14a. Collector currents $I_1$ and $I_2$ change in response to the differential voltage $V_d$. However, the sum of collector currents $I_1$ and $I_2$ always equals $I_T$. When transistors 12a and 14a are matched, collector currents $I_1$ and $I_2$ are the same and equal (½$I_T$) when $V_d$ is zero, i.e., when input voltages at the base terminals of transistors 12a and 14a are the same. When a differential voltage is applied to $V_d$, currents $I_1$ and $I_2$ will either increase or decrease depending on the polarity of voltage $V_d$. Referring to FIG. 1a, if a positive $V_d$ is applied, the collector currents $I_1$ and $I_2$ will become:

$I_1 = ½I_T + \Delta I$, and $I_2 = ½I_T - \Delta I$, where $\Delta I$ is the change in collector current due to $V_d$. A differential output current and a differential output voltage develop at the collector terminals of transistors 12a and 14a.

A differential pair can also be constructed using MOS transistors as shown in FIG 1b. NMOS transistors 12b and 14b form a differential pair biased by current source 10b. One skilled in the art will appreciate that the operation of the MOS differential pair in FIG. 1b is analogous to the bipolar differential pair in FIG. 1a. One skilled in the art will also appreciate that PNP transistors or PMOS transistors can be used to form the differential pair as shown in FIGS. 2a and 2b respectively.

The conventional differential pairs illustrated in FIGS. 1a–b and 2a–b have several disadvantages. One disadvantage of the conventional differential pair is that in order to increase the gain of the differential pair, the tail current $I_T$ needs to be increased. In the differential pairs illustrated above, the gain is maximized when $\Delta I$, the change in collector current in response to the differential input voltage $V_d$, is maximized. The change in current $\Delta I$ is a function of the transconductance ($g_m$) of the transistors and is defined by the equation:

$\Delta I = g_m V_d$.

The transconductance $g_m$ of a transistor is a function of the DC collector or source current and the threshold voltage of the transistor. The transconductance $g_m$ of the bipolar differential pair is given by:

$$g_m = \frac{\frac{1}{2}I_T}{V_T}$$

where $V_T$ is the threshold voltage of the bipolar transistor. Similarly, the transconductance of the MOS differential pair is given by:

$$g_m = 2\sqrt{K\left(\frac{I_T}{2}\right)}$$

where K is a parameter relating to the device characteristics of the MOS transistor. In order to increase the gain of the conventional differential pair (that is, to maximize $\Delta I$), the transconductance $g_m$ of equations for $g_m$ provided above, increasing $g_m$ requires increasing the tail current $I_T$. However, it is undesirable to increase the tail current $I_T$ because a large $I_T$ causes an increase in the quiescent current of the circuit, resulting in increased heat and power consumption.

Another disadvantage of the conventional differential pair is that the common mode input voltage $V_{cm}$ cannot be brought to ground while still maintaining operation of the differential pair. The common mode input voltage $V_{cm}$ is a voltage added to the differential input voltage $V_d$ before the input voltages are applied to the input terminals of the differential pair. Defining $V_1$ as the input voltage applied to the gate or base of one of the transistors of the differential pair, and $V_2$ as the input voltage applied to the base or gate of the other transistor in the differential pair, the differential input voltage $V_d$ and the common mode input voltage $V_{cm}$ are defined as:

$$V_{cm} = \frac{V_1 + V_2}{2}.$$

Following the above equations, the input voltages $V_1$ and $V_2$ are given by:

$$V_1 = V_{cm} + \frac{V_d}{2}, \text{ and}$$

$$V_2 = V_{cm} - \frac{V_d}{2}.$$

Using the NPN differential pair of FIG. 1a as an example, voltage $V_{cm}$ cannot be brought to ground by setting voltages V1 and V2 to zero volt because a minimum voltage of ($V_{BE} + V_{CE(sat)}$) must be kept at the emitter terminals of transistors 12a and 14a in order to keep current source $I_T$ on. The situation is the same for the PNP differential pair shown in FIG. 2a. Since the collector terminals of transistors 22a and 22b are typically connected to a current mirror acting as an active load for the output of the differential pair. The common mode voltage $V_{cm}$ cannot be brought to ground because the current mirror will be shut off.

The conventional differential pair has yet another disadvantage of a limited slew rate due to the tail current $I_T$. This is described with reference to FIG. 3, which is a circuit schematic of a conventional bipolar differential amplifier. Differential amplifier 300 includes an emitter-coupled differential pair (NPN transistors N1 and N2) coupled to a current mirror (transistors P1 and P2) as the active load. A differential voltage $V_d$ is applied to the base terminals (nodes 314 and 316) of transistors N1 and N2. Constant current source 312, connected to the emitter terminals of transistors N1 and N2 (node 308), provides a constant tail current $I_T$ to the differential pair. The output terminal of the differential pair (node 318) is connected to an integrating stage including an amplifier 302 and a compensation capacitor 304. Amplifier 302 and compensation capacitor 304 are connected in parallel between node 318 and node 320. Node 320 is the output voltage Vout of different amplifier 300.

One important performance parameter of a differential amplifier is the slew rate which measures how closely the output voltage Vout tracks changes in the input differential voltage $V_d$. Slew rate is defined as the rate of change of the output voltage Vout before Vout reaches its final value. The slew rate is limited by the amount of current available at the output of the differential pair (node 318) to charge compensation capacitor 304 when a large differential input voltage is applied. Thus, the maximum slew rate attainable for differential amplifier 300 is limited by the maximum current that the different pair (transistors N1 and N2) can deliver at output node 318 to charge capacitor 304. For differential amplifier 300, the maximum current is the maximum collector current of transistor N2, which is the tail current $I_T$. Therefore, the maximum slew rate for differential amplifier 300 is provided by:

$$\text{Slew Rate} = \frac{dV_{out}}{dt}\bigg|_{max} = \frac{I_T}{C_c}$$

where Cc is the capacitance of compensation capacitor 304. In order to attain a very high slew rate, either the tail current $I_T$ needs to be increased or the capacitance Cc of capacitor 304 needs to be decreased. However, it is undesirable to decrease the compensation capacitance Cc because circuit stability will be compromised. Therefore, the tail current $I_T$ has to be increased to attain a high slew rate. As described above, increasing $I_T$ is not desirable because it leads to an increase in quiescent current in the circuit.

FIG. 4 is a circuit diagram of a differential amplifier 400 constructed of an NMOS differential pair and a PMOS current mirror. One skilled in the art will appreciate that the operation of differential amplifier 400 is analogous to differential amplifier 300 in FIG. 3, and differential amplifier 400 suffers the same shortcomings as amplifier 300.

Therefore, the conventional differential pairs are unsatisfactory because gain and slew rate improvement cannot be achieved without the undesirable effect of increasing the quiescent current of the circuit. Furthermore, the common mode input voltage cannot be brought to ground while still maintaining operation of the differential pair.

SUMMARY OF THE INVENTION

According to one embodiment of the present invention, a differential pair includes a first transistor and a second transistor where each of the transistors has a control terminal and each control terminal is connected to a first input voltage terminal. The differential pair also includes a third transistor and a fourth transistor where each of the transistors has a control terminal and each control terminal is connected to a second input voltage terminal. Each of the first, second, third, and fourth transistors has a first current handling terminal coupled to a first reference voltage, typically the power supply or ground. The differential pair further includes a first current mirror and a second current mirror. The first current mirror has a first bias terminal coupled to a second current handling terminal of the first transistor and a second bias terminal coupled to a second current handling terminal of the second transistor. The first current mirror also includes a first output terminal. The second current mirror has a first bias terminal coupled to a second current handling terminal of the fourth transistor and a second bias terminal coupled to a second current handling terminal of the third transistor. The second current mirror has a second output terminal. The differential pair further includes a resistor coupled between the second current handling terminals of the second and third transistors.

In operation, when a differential voltage is applied to the first input voltage terminal and the second input voltage terminal, a first voltage develops across the resistor. The first voltage is substantially equal to the differential input voltage and causes a current to flow in the resistor. The current flowing in the resistor in turn causes the currents flowing in the first and second output terminals of the first and second current mirrors to vary in response to the differential input voltage.

In accordance with another embodiment of the present invention, the differential pair is constructed of bipolar transistors. In another embodiment of the present invention, the differential pair is constructed of MOS transistors.

In accordance with yet another embodiment of the present invention, a complementary differential pair can be formed by combining a PNP or PMOS differential pair and a NPN or NMOS differential pair.

The differential pair according to the embodiments of the present invention is capable of attaining a high slew rate and a possible common mode input voltage of ground while drawing only a small quiescent current.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

Figure 1A:
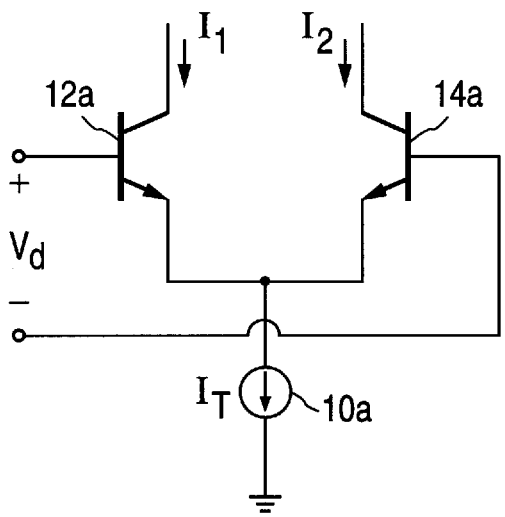
FIG. 1a is a circuit schematic for a conventional emitter-coupled differential pair constructed of NPN transistors.
Figure 1B:
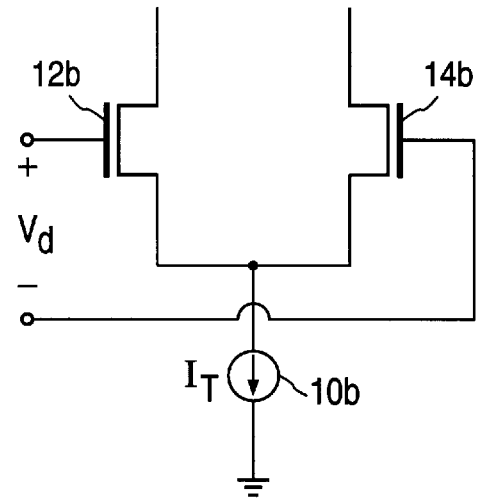
FIG. 1b is a circuit schematic for a conventional source-coupled differential pair constructed of NMOS transistors.
Figure 2A:
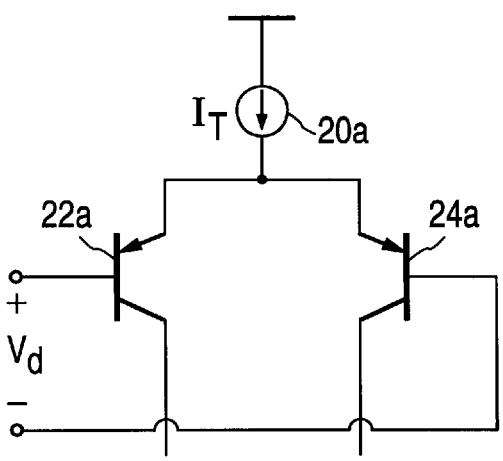
FIG. 2a is a circuit schematic for a conventional emitter-coupled differential pair constructed of PNP transistors.
Figure 2B:
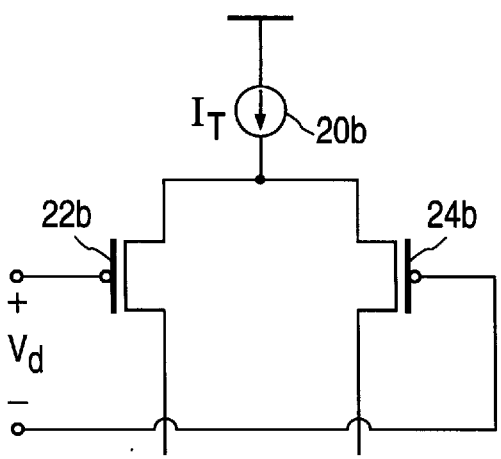
FIG. 2b is a circuit schematic for a conventional source-coupled differential pair constructed of PMOS transistors.
Figure 3:
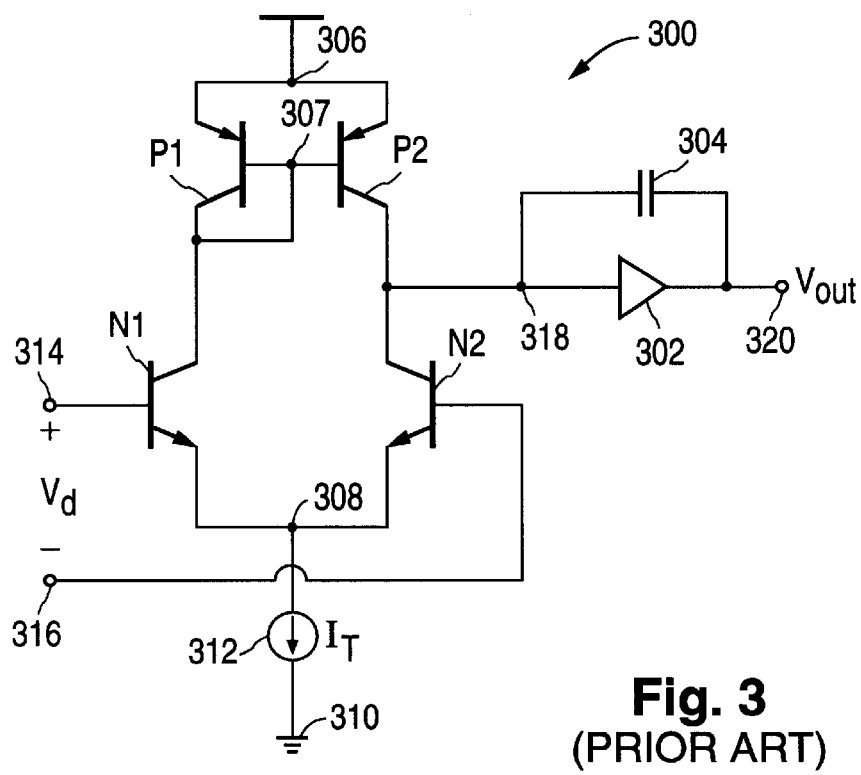
FIG. 3 is a circuit schematic of a conventional differential amplifier constructed of an NPN differential pair.
Figure 4:
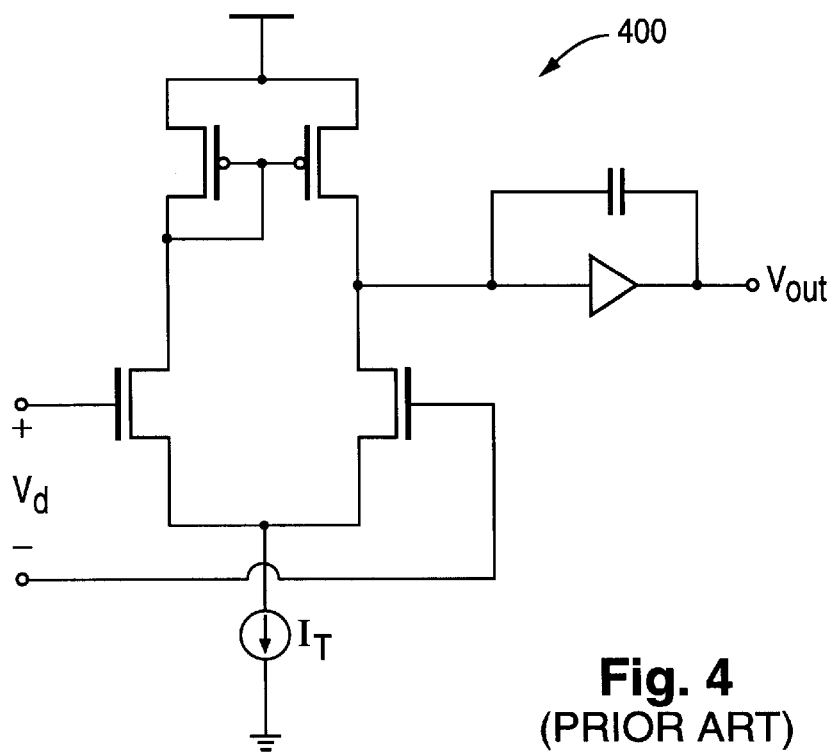
FIG. 4 is a circuit schematic of a conventional differential amplifier constructed of an NMOS differential pair.
Figure 5:
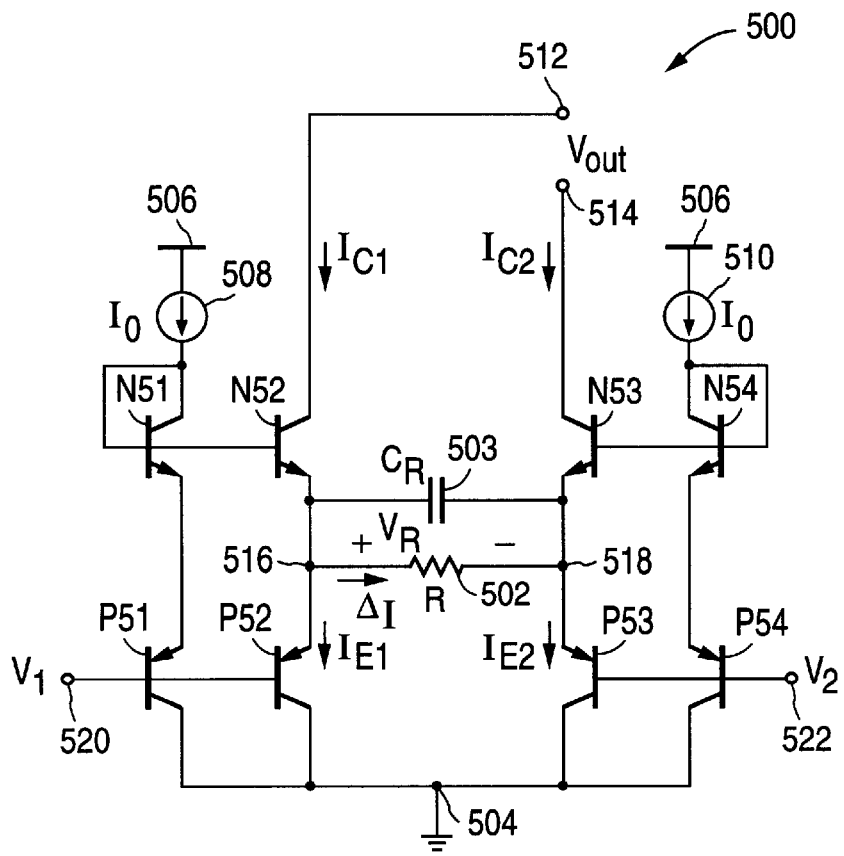
FIG. 5 is a circuit schematic of a PNP differential pair according to one embodiment of the present invention.

A differential pair is described having a high slew rate and a possible common mode input voltage of ground while drawing only a small quiescent current. FIG. 5 is a circuit schematic of a PNP differential pair according to one embodiment of the present invention. Referring to FIG. 5, differential pair 500 includes PNP transistors P51, P52, P53 and P54. The base terminals of transistors P51 and P52 are connected together and are coupled to a first input voltage $V_1$ (node 520). Similarly, the base terminals of transistors P53 and P54 are connected together and are coupled to a second input voltage $V_2$ (node 522). The collector terminals of transistors P51, P52, P53 and P54 are connected to a ground potential (node 504). In other embodiments, the collector terminals can be connected to a negative power supply terminal.

The emitter terminals of transistors P51 and P52 are coupled to a current mirror formed by NPN transistors N51 and N52. Transistor N51 is diode-connected (i.e., its base and collector terminals are connected together) and its collector terminal is driven by a constant current source 508 providing a constant current $I_0$. The collector current $I_{C1}$ at transistor N52 can be set to be any multiple of current $I_0$ by changing the geometry, for example, the emitter area, of transistor N52. The same analysis applies to NPN transistors N53 and N54 which form a current mirror for transistors P53 and P54. The collector current $I_{C2}$ of transistor N53 can be set to any multiple of current $I_0$, provided by a constant current source 510. In the following discussion, it is assumed that the emitter areas of transistors N52 and N53 are selected such that currents $I_{C1}$ and $I_{C2}$ each equals $I_0$. In the present embodiment, constant current sources 508 and 510 are shown as two separate current sources. However, one skilled in the art will appreciate that one current source will suffice to supply a constant current $I_0$ to both transistors N51 and N54.

A resistor 502, having a resistance value of R, is coupled between the emitter terminals of transistors P52 (node 516) and P53 (node 518). In operation, when a voltage $V_R$ develops across resistor 502, a current $\Delta I$ flows through resistor 502. The resistance R of resistor 502 is chosen to provide the desired gain for differential pair 500. As will be described in more detail below, resistance R can be chosen so as to maximize current $\Delta I$, which in turn maximizes the gain of differential pair 500.

In the present embodiment, resistor 502 is a polysilicon resistor. However, in other embodiments, resistor 502 can be any type of resistor, such as a diffusion resistor, suitable for the fabrication of differential pair 500.

The output voltage Vout of differential pair 500 is provided at the collector terminals of transistors N52 and N53 (nodes 512 and 514). When differential pair 500 is incorporated in a desired analog circuit, output voltage Vout drives the next stage of the circuit.

In operation, when a differential input voltage is applied at nodes 520 and 522 of differential pair 500, collector currents $I_{C1}$ and $I_{C2}$ change in response to the differential input voltage $V_d$, which is defined as:

$$V_d = V_1 - V_2.$$

The voltages at the emitter terminals of transistors P52 and P53 (nodes 516 and 518) are given by:

$$V_{516} = V_1 + V_{BE}, \text{ and}$$

$$V_{518} = V_2 + V_{BE},$$

where $V_{BE}$ is the base to emitter voltage of transistors P52 and P53. The voltage across resistor 502, $V_R$, is the difference between voltages $V_{516}$ and $V_{518}$. Thus, $$V_R = V_{516} - V_{518} = V_d.$$

When $V_1$ equals $V_2$ and $V_d$ is zero, $V_R$ is also zero and no current flows through resistor 502. Thus, currents $I_{C1}$ and $I_{C2}$ each equals $I_0$. However, when a differential voltage is applied to $V_1$ (node 520) and $V_2$ (node 522) such that $V_d$ does not equal to zero, the differential voltage appears across resistor 502 (i.e., between nodes 516 and 518) and current $\Delta I$ flows through resistor 502. The resistor current $\Delta I$ is defined as:

$$\Delta I = \frac{V_d}{R}$$

where R is the resistance of resistor 502. As set forth above, the transconductance ($g_m$) of the differential pair is defined as ($\Delta I = g_m V_d$). Therefore, the transconductance of differential pair 500 is given by:

$$g_m = 1/R.$$

The collector currents $I_{C1}$ and $I_{C2}$ become:

$$I_{C1} = I_0 + \frac{\Delta I}{2}, \text{ and } I_{C2} = I_0 - \frac{\Delta I}{2}.$$

The emitter currents $I_{E1}$ and $I_{E2}$ flowing into transistors P52 and P53 are given by:

$$I_{E1} = I_0 - \frac{\Delta I}{2}, \text{ and } I_{E2} = I_0 + \frac{\Delta I}{2}.$$

The gain of differential pair 500 is maximized when $\Delta I$ is maximized. Referring to the above equation, $\Delta I$ can be maximized either by applying a large differential input voltage $V_d$ or by selecting a very small resistance value R for resistor 502. Thus, $\Delta I$ can be designed to be as large as needed to achieve a desired gain for differential pair 500 while maintaining a low quiescent current because $\Delta I$ is maximized without increasing the tail current $I_0$.

For the bipolar differential pair 500, the maximum $\Delta I$ is defined as:

$$\Delta I_{max} = I_0 \beta_{npn}$$

where $\beta_{npn}$ is the current gain of transistors N52 and N53. Therefore, current $I_0$ can be designed to be very small while the maximum $\Delta I$, and thus the gain, can be made to be very large through the gain $\beta_{npn}$ of transistors N52 and N53. By choosing a small current value for $I_0$, the quiescent current of the differential pair is kept at a low level. The reduction in quiescent current and the improvement in the gain of the differential pair of the present invention represent a significant improvement over conventional differential pairs.

For differential pair 500, the common mode input voltage can be brought to the ground potential while still maintaining circuit operation. Referring to FIG. 5, when voltages $V_1$ and $V_2$ (nodes 520 and 522 respectively) are driven to ground, transistors P52 and P53 are still turned on and current $I_0$ flows through the transistors. Specifically, the emitter terminals of transistors P51 and P52 are biased to a threshold voltage above ground such that when voltage $V_1$ (node 520) is driven to ground, transistors P51 and P52 are still turned on. The same holds true for transistors P53 and P54. Thus, differential pair 500 eliminates another disadvantage of the conventional differential pairs by allowing the common mode input voltage to be brought to ground.

Differential pair 500 may further include a capacitor 503 connected in parallel with resistor 502 and having a capacitance $C_R$. When differential pair 500 is operated in a high frequency AC mode, capacitor 503 operates to reduce the effective resistance of resistor 502 and increase the gain of differential pair 500. By incorporating capacitor 503 in differential pair 500, the bandwidth of operation can be improved appreciably.

Differential pair 500 is able to operate at a very high slew rate and achieves significant improvement over conventional differential pairs. The improvement in slew rate will be discussed in more detail below with reference to FIG. 11.

Figure 6:
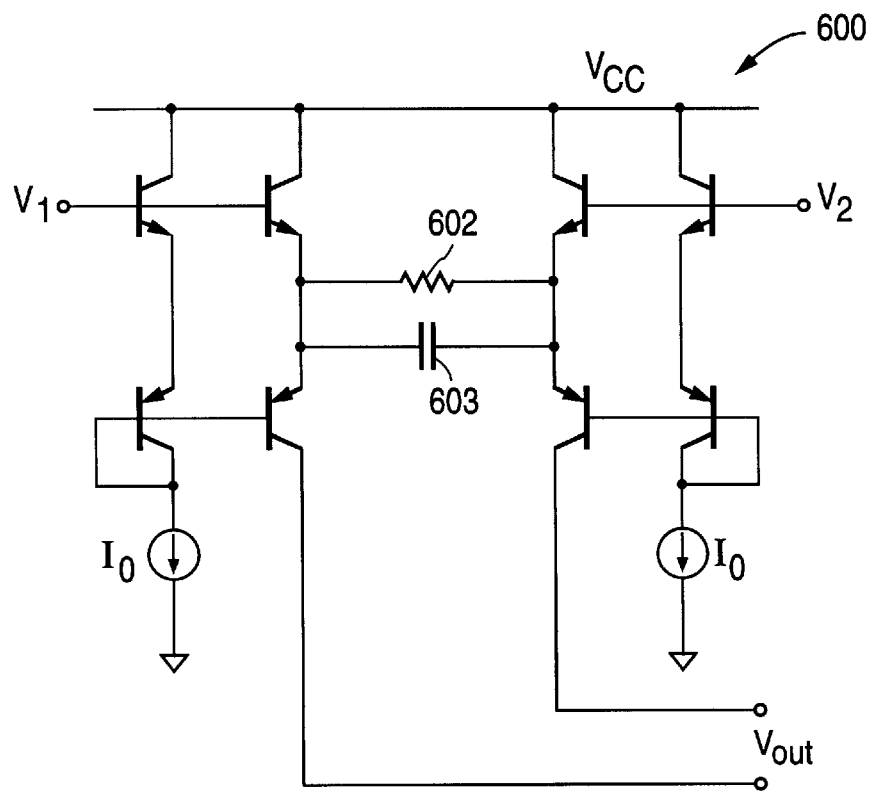
FIG. 6 is a circuit schematic of a PMOS differential pair according to another embodiment of the present invention.

In FIG. 5, differential pair 500 is constructed using PNP transistors. A differential pair according to the present invention can also be constructed using NPN transistors as shown in FIG. 6. The NPN differential pair 600 is formed by substituting PNP transistors in FIG. 5 with NPN transistors and reversing the polarities of the power supply and ground. For NPN differential pair 600, the common mode input voltage can be brought up to the power supply voltage (Vcc) while still maintaining operation of the differential pair. In NPN differential pair 600, capacitor 603 is optional and can be added in parallel with resistor 602 to improve the bandwidth of operation.

Figure 7:
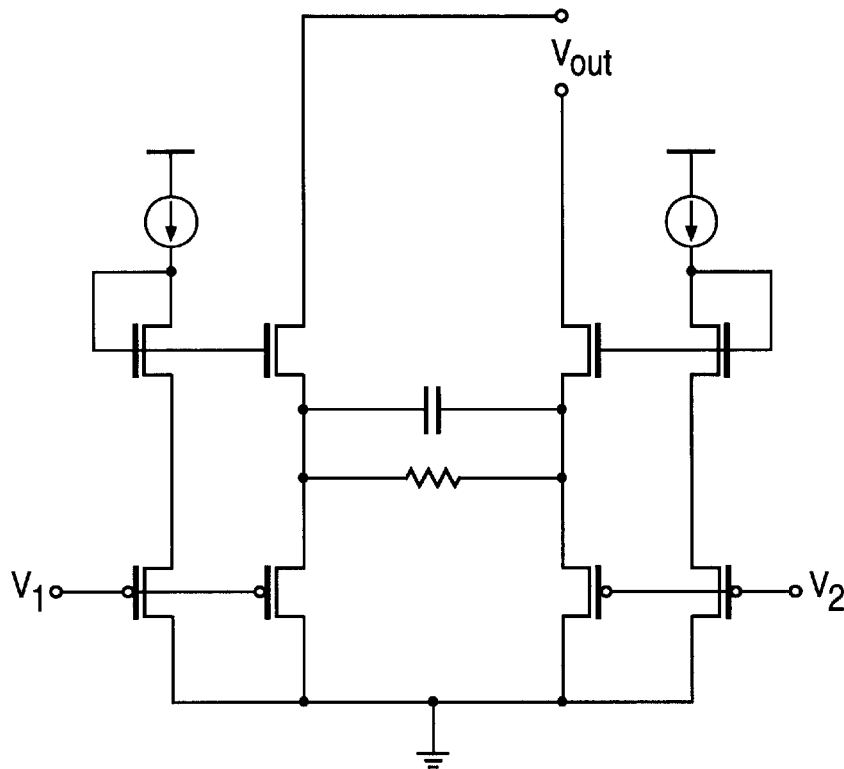
FIG. 7 is a circuit schematic of a NPN differential pair according to another embodiment of the present invention.
Figure 8:
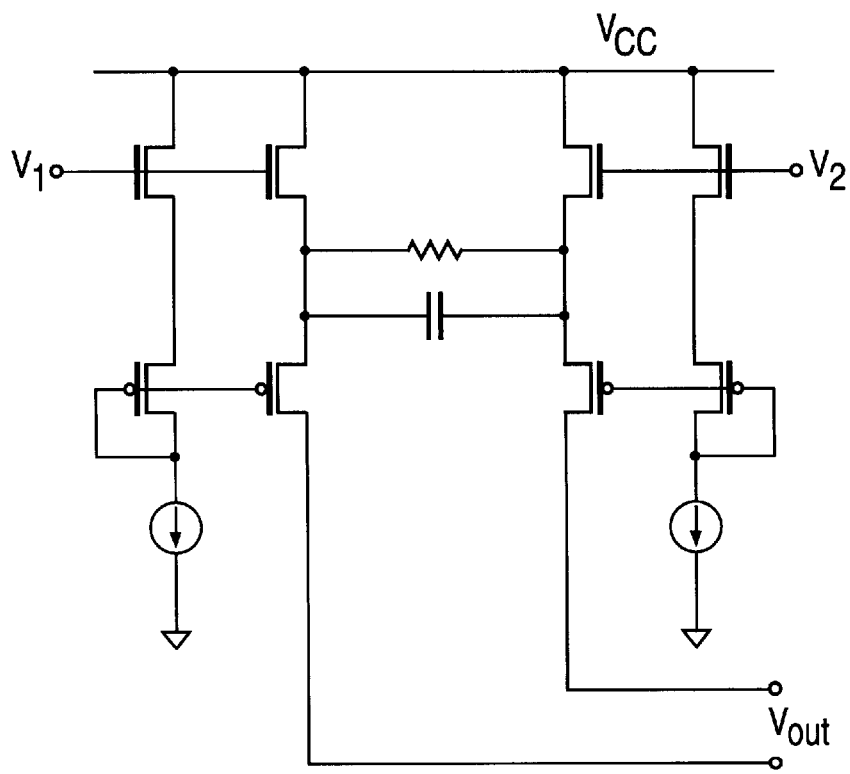
FIG. 8 is a circuit schematic of a NMOS differential pair according to another embodiment of the present invention.

In accordance with another embodiment of the present invention, the differential pair can be implemented using MOS transistors. FIGS. 7 and 8 are circuit schematics of a PMOS differential pair and an NMOS differential pair, respectively. The configuration of the PMOS differential pair in FIG. 7 is analogous to PNP differential pair 500 of FIG. 5. Similarly, the configuration of the NMOS differential pair in FIG. 8 is analogous to the NPN differential pair of FIG. 6. One skilled in the art will appreciate that the PMOS and NMOS differential pairs operate in an analogous fashion as the PNP and NPN differential pairs previously described. The PMOS and NMOS differential pairs are capable of achieving the same level of performance improvement previously described with reference to differential pair 500.

Figure 9:
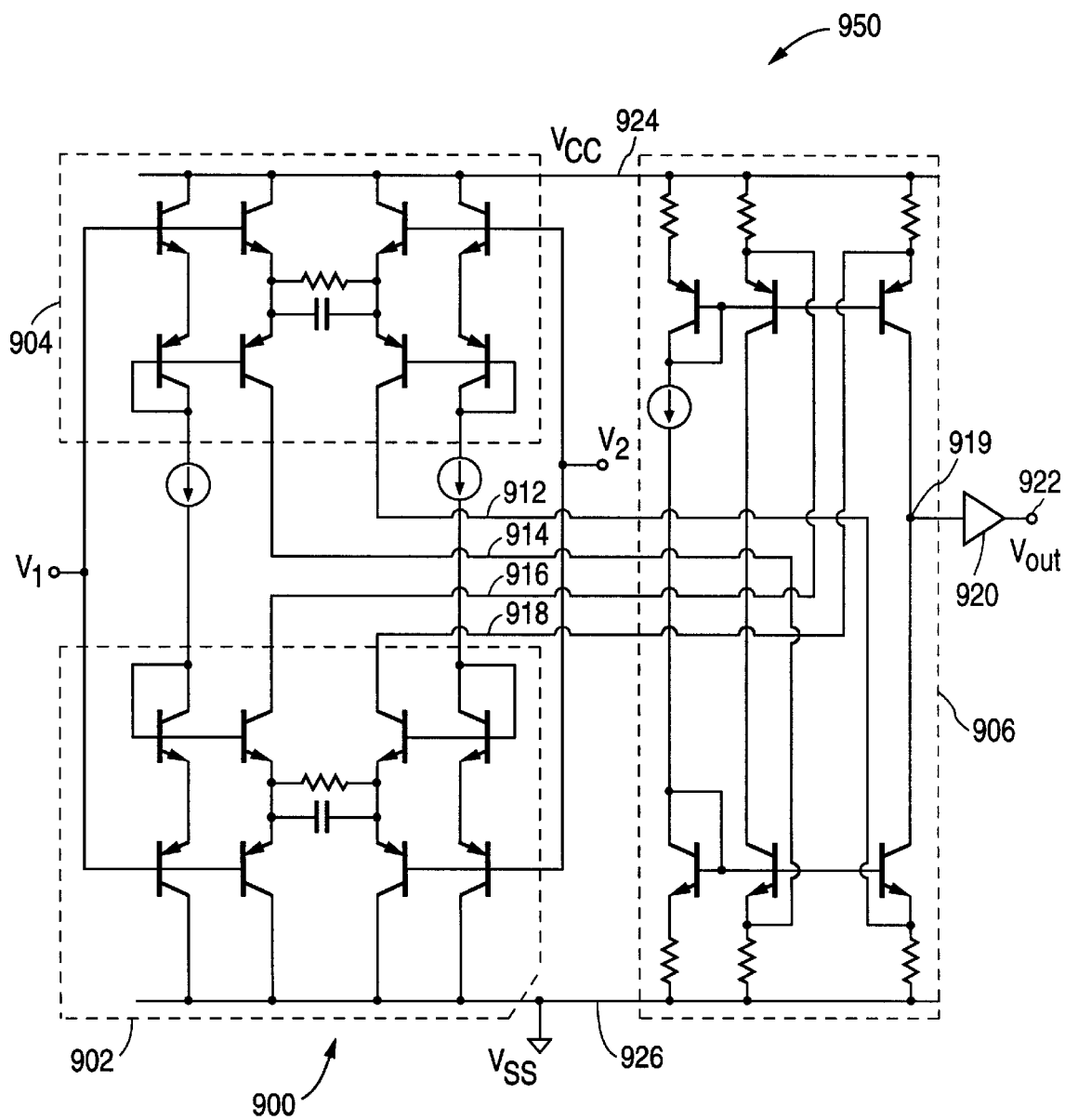
FIG. 9 is a circuit schematic of a bipolar complementary differential pair according to another embodiment of the present invention.
Figure 10:
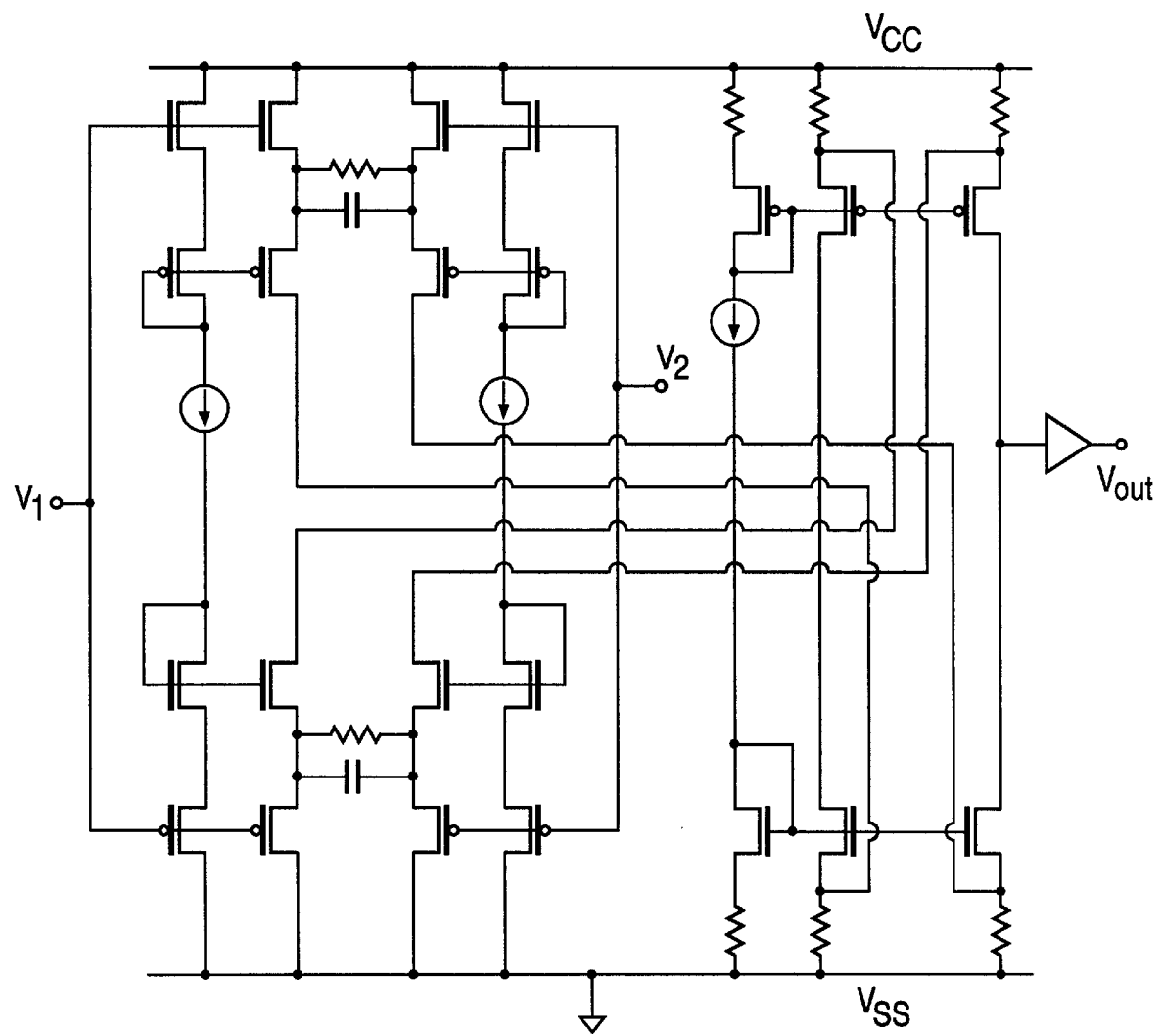
FIG. 10 is a circuit schematic of a MOS complementary differential pair according to another embodiment of the present invention.

Furthermore, in accordance with yet another embodiment of the present invention, a complementary differential pair can be formed by combining a PNP or PMOS differential pair with an NPN or NMOS differential pair. FIG. 9 is a circuit schematic of a differential amplifier 950 incorporating a complementary differential pair 900 according to one embodiment of the present invention. Complementary differential pair 900 includes a PNP differential pair 902 and an NPN differential pair 904 connected in series between the Vcc terminal (node 924) and the ground terminal (node 926). Differential pairs 902 and 904 are constructed in the same manner as previously described with reference to FIGS. 5 and 6. The output terminals (912, 914, 916, and 918) of complementary differential pair 900 are coupled to a differential to single-ended conversion stage 906. The operation of stage 906 is well known in the art. Stage 906 converts the four differential inputs from complementary differential pair 900 and provides a singled-ended output at node 919 representative of the voltage difference between input voltage $V_1$ and $V_2$. The singled-ended output (node 919) is coupled to a buffer stage 920 to provide an output voltage Vout at node 922. One skilled in the art will appreciate that a complementary differential pair can also be implemented using MOS transistors. FIG. 10 is a circuit schematic of a MOS differential amplifier incorporating a MOS complementary differential pair according to one embodiment of the present invention. The operation of the differential amplifier in FIG. 10 is analogous to that of amplifier 950 in FIG. 9.

Figure 11:
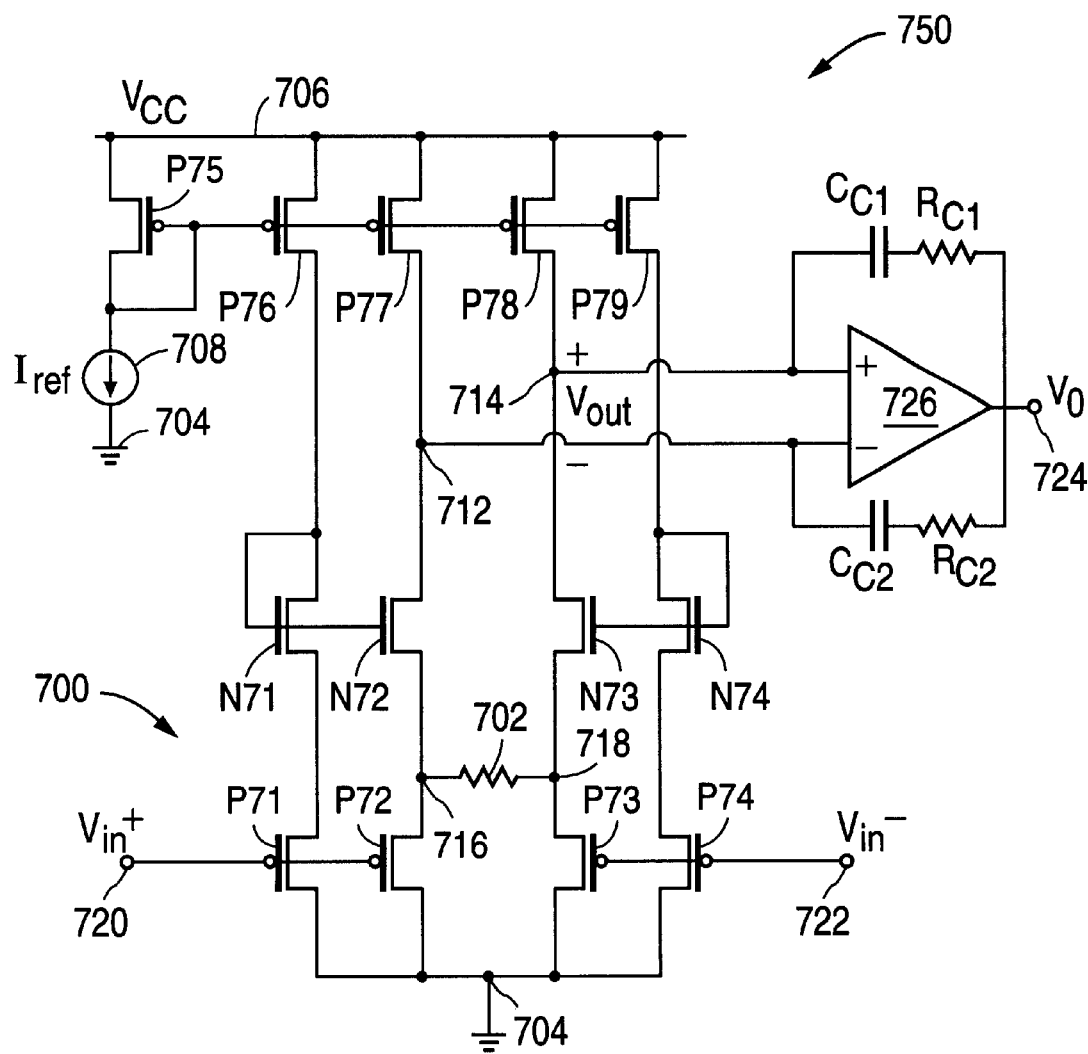
FIG. 11 is a circuit schematic for a differential amplifier incorporating a PMOS differential pair of one embodiment of the present invention.

The slew rate improvement realized in the differential pairs of aforementioned embodiments of the present invention will now be described with reference to FIG. 11. FIG. 11 is a circuit schematic of a differential amplifier 750 incorporating a PMOS differential pair 700. In differential amplifier 750, constant current source 708 provides a reference current $I_{ref}$ to a current mirror formed by transistors P75 to P79. The reference current $I_{ref}$ is scaled and mirrored by transistors P76 to P79 to generate a constant current $I_0$ driving the drain terminals of transistors N71 to N74. Transistors P77 and P78 act as active loads for the output voltage Vout of differential pair 700. The output voltage Vout (nodes 714 and 712) of differential pair 700 are coupled to a differential to single-ended conversion and output stage 726. Two capacitor and resistor pairs, $C_{C1}$–$R_{C1}$ and $C_{C2}$–$R_{C2}$, provide compensation for differential amplifier circuit 750.

The slew rate of differential amplifier circuit 750 is maximized because the drain currents ($I_{D1}$ and $I_{D2}$) available at output nodes 712 and 714 to charge capacitors $C_{C1}$ and $C_{C2}$ is maximized through the $\Delta I$ component. Specifically, the drain currents $I_{D1}$ and $I_{D2}$ of transistors N72 and N73 is given by:

$$I_{D1} = I_0 + \frac{\Delta I}{2}, \text{ and } I_{D2} = I_0 - \frac{\Delta I}{2}.$$

As described above, current $\Delta I$ through resistor 702 of differential pair 700 can be made to be significantly large by selecting the appropriate resistance value for resistor 702. For differential amplifier 750, the slew rate is given by:

$$\text{Slew Rate} = \frac{\Delta I_{max}}{C_C}.$$

For PMOS differential pair 700, $\Delta I_{max}$ is the maximum current either transistor N72 or transistor N73 can deliver when the transistor is fully on. For a bipolar differential pair such as differential pair 500 of FIG. 5 described above, $\Delta I_{max}$ is equal to $I_0 \beta_{npn}$ where $\beta_{npn}$ is the current gain of transistors N52 and N53.

Because the slew rate can be improved merely by maximizing $\Delta I$, there is no need to decrease the capacitance of compensation capacitors $C_{C1}$ and $C_{C2}$. Thus, for differential amplifier 750, a very high slew rate can be attained without compromising circuit stability.

The detailed description above is provided to illustrate specific embodiments of the present invention and is not intended to be limiting. Numerous modifications and variations within the scope of the present invention are possible. For example, the capacitor in FIGS. 5–8 is an optional element and may be included for enhancing the bandwidth of the differential pair. The present invention is set forth in the following claims.

I claim:

1. A circuit, comprising:
    a first transistor and a second transistor of a first type, each of said first and second transistors having a control terminal, each control terminal being coupled to a first input voltage terminal;

a third transistor and a fourth transistor of said first type, each of said third and forth transistors having a control terminal, each control terminal being coupled to a second input voltage terminal;

each of said first, second, third, and fourth transistors having a first current handling terminal, each first current handling terminal being coupled to a first reference voltage;

a first current mirror having a first bias terminal coupled to a second current handling terminal of said first transistor and a second bias terminal coupled to a second current handling terminal of said second transistor, said first current mirror having a first output terminal;

a second current mirror having a first bias terminal coupled to a second current handling terminal of said fourth transistor and a second bias terminal coupled to a second current handling terminal of said third transistor, said second current mirror having a second output terminal;

a first resistor coupled between said second current handling terminals of said second and third transistors;

a fifth transistor and a sixth transistor of a second type opposite said first type, each of said fifth and sixth transistors having a control terminal, each control terminal being coupled to said first input voltage terminal;

a seventh transistor and an eighth transistor of said second type, each of said seventh and eighth transistors having a control terminal, each control terminal being coupled to said second input voltage terminal;

each of said fifth, sixth, seventh, and eighth transistors having a first current handling terminal, each first current handling terminal being coupled to a second reference voltage;

a third current mirror having a first bias terminal coupled to a second current handling terminal of said fifth transistor and a second bias terminal coupled to a second current handling terminal of said sixth transistor, said third current mirror having a third output terminal;

a fourth current mirror having a first bias terminal coupled to a second current handling terminal of said eighth transistor and a second bias terminal coupled to a second current handling terminal of said seventh transistor, said fourth current mirror having a fourth output terminal; and a second resistor coupled between said second current handling terminals of said sixth and seventh transistors;

wherein said transistors of said first type are PMOs transistors, and said transistors of said second type are NMOS transistors, and when a differential voltage is applied to said first input voltage terminal and said second input voltage terminal, a first voltage develops across said first resistor and a second voltage develops across said second resistor, each of said first and second voltages having a value substantially equal to said differential voltage.

2. The circuit of claim 1 further comprising:

a first capacitor coupled between said second current handling terminals of said second and third transistors; and a second capacitor coupled between said second current handling terminals of said sixth and seventh transistors.

3. The circuit of claim 1, wherein each of said first, second, third, and fourth current mirrors comprises:

a first transistor being diode connected and having a first current handling terminal coupled to a reference current source, and a second current handling terminal coupled to said first bias terminal of said respective one of said current mirrors; and a second transistor having a control terminal coupled to a control terminal of said first transistor, a first current handling terminal coupled to said output terminal of said respective one of said current mirrors, and a second current handling terminal coupled to said second bias terminal of said respective one of said current mirrors.

4. The circuit of claim 1, wherein said first and second resistors are polysilicon resistors.

5. A differential amplifier circuit, comprising:

a first PMOS transistor and a second PMOS transistor, each of said first and second PMOS transistors having a control terminal, each control terminal being coupled to a first input voltage terminal;

a third PMOS transistor and a fourth PMOS transistor, each of said third and fourth PMOS transistors having a control terminal, each control terminal being coupled to a second input voltage terminal;

each of said first, second, third, and fourth PMOS transistors having a first current handling terminal, each first current handling terminal being coupled to a first reference voltage;

a first current mirror coupled to a second current handling terminal of said first PMOS transistor and a second current handling terminal of said second PMOS transistor, said first current mirror having a first output terminal;

a second current mirror coupled to a second current handling terminal of said third PMOS transistor and a second current handling terminal of said fourth PMOS transistor, said second current mirror having a second output terminal;

a resistor coupled between said second current handling terminals of said second and third PMOS transistors;

a third current mirror coupled to a constant current source and to said first and second current mirrors to provide a bias current;

a differential-to-single-ended-output conversion stage coupled to said first and second output terminals of said first and second current mirrors and having an output terminal;

a first compensation capacitor and a first compensation resistor connected in series, a first terminal of said first compensation capacitor being coupled to said second output terminal of said second current mirror and a first terminal of said first compensation resistor being coupled to said output terminal of said differential-to-single-ended output conversion stage; and a second compensation capacitor and a second compensation resistor connected in series, a first terminal of said second compensation capacitor being coupled to said first output terminal of said first current mirror and a first terminal of said second compensation resistor being coupled to said output terminal of said differential-to-single-ended output conversion stage;

wherein when a differential voltage is applied to said first input voltage terminal and said second input voltage terminal, a first voltage develops across said resistor having a value substantially equal to said differential voltage.

6. The differential amplifier circuit of claim 5, further comprising a capacitor coupled between said second current handling terminals of said second and third transistors.

* * * * *